(12) United States Patent
Kanno

(10) Patent No.: US 6,369,625 B1
(45) Date of Patent: Apr. 9, 2002

(54) PHASE LOCKED LOOP CIRCUIT

(75) Inventor: Hiroshi Kanno, Miyagi (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/638,879

(22) Filed: Aug. 15, 2000

(30) Foreign Application Priority Data

Oct. 27, 1999 (JP) .......................................... 11-304788

(51) Int. Cl.[7] ................................................. H03L 7/06
(52) U.S. Cl. ...................................... 327/156; 327/160
(58) Field of Search ................................ 327/141, 142, 327/147–150, 155–159, 172–176; 331/17; 375/373–375

(56) References Cited

U.S. PATENT DOCUMENTS

| | | | | |
|---|---|---|---|---|
| 5,929,677 A | * | 7/1999 | Murata | ........................ 327/157 |
| 6,137,368 A | * | 10/2000 | Cho | ............................ 331/16 |
| 6,154,071 A | * | 11/2000 | Nogawa | ...................... 327/156 |
| 6,173,025 B1 | * | 1/2001 | Jokura | ......................... 375/376 |
| 6,229,399 B1 | * | 5/2001 | Tobise et al. | ................. 331/17 |

* cited by examiner

Primary Examiner—My-Trang Nu Ton
(74) Attorney, Agent, or Firm—Young & Thompson

(57) ABSTRACT

A PLL circuit can reduce possibility of occurrence of data error even with a high speed data and reduces influence of noise, due to external disturbance or the like. The PLL circuit includes phase difference detecting means for detecting a phase difference of an output signal in relation to an input signal, oscillating means for outputting an output signal having a repetition frequency corresponding to a voltage level of a phase difference signal representative of the phase difference detected by the phase difference detecting means, and control means active when phase advanced condition or phase retarded condition of the output signal relative to the input signal is continued, for control a voltage level of the frequency difference signal depending upon number of times where phase advanced condition or phase retarded condition of the output signal relative to the input signal is continued.

9 Claims, 13 Drawing Sheets

PHASE LOCKED LOOP CIRCUIT

BACKGROUND OF THE INVENTION

1. Field of the Invention

The present invention relates to a phase locked loop (PLL) circuit. More particularly, the invention relates to a PLL circuit varying a repetition frequency of an output signal depending upon a result of comparison of an input signal having a reference frequency (hereinafter referred to as "reference input signal") and an output signal having a dependent frequency to depend on the reference input signal.

2. Description of the Related Art

In general, as shown in FIG. 15, a PLL circuit includes a phase comparator 1 performing phase comparison with a reference input signal and a voltage controlled oscillator 3 (hereinafter referred to as "VCO") varying oscillation frequency depending upon a result of phase comparison, and feeds back an output signal 300 of the VCO 3 to the phase comparator 1 as an object for phase comparison. In this case, a signal indicative of the result of phase comparison of the phase comparator 1 is converted into a voltage level smoothed by a low pass filter 2 (hereinafter referred to as "LPF"). By the voltage level, variation of an oscillation frequency of the VCO 3 is controlled.

On the other hand, the output signal 300 output from the VCO 3 becomes a dependent frequency signal 400 by frequency division into N by a frequency divider 4 and is input to the phase comparator 1. On the other hand, the reference input signal 100 becomes a reference input signal 500 by a frequency division into N by a frequency divider 5 and is input to the phase comparator 1. As set forth above, in practice, phases are compared with respect to frequency divided signals, i.e. the reference input signal 500 and the dependent frequency signal 400 for controlling the oscillation frequency depending upon the result of phase comparison.

In the PLL circuit, even when a phase relationship between the reference input signal and the dependent frequency signal is constant under a condition where an operation environment is constant, the dependent frequency signal is varied by variation of operation environment due to variation of power source fluctuation and variation of environmental temperature. Therefore, as a result, fluctuation is caused due to phase difference between the reference input signal and the dependent frequency signal. Upon changing data by establishing synchronization of data which is synchronized with the reference input signal, with the dependent frequency signal, changing of data becomes more difficult at higher speed data to be a cause of data error. On the other hand, when an alarm output is used in data processing, high precision becomes necessary as demanded to possibly be influenced by noise due to external disturbance or so forth.

The conventional PLL circuit as set forth above, encounters a problem to cause data error due to variation of the dependent frequency signal for variation of operation environment caused by fluctuation of the power source and variation of environmental temperature to result in fluctuation of phase difference between the reference input signal and the dependent frequency signal, and if fluctuation of the phase difference is caused, upon changing data by establishing synchronization of data which is synchronized with the reference input signal, with the dependent frequency signal, changing of data becomes more difficult at higher speed data to be a cause of data error.

SUMMARY OF THE INVENTION

The present invention has been worked out in view of the problem set forth above. It is therefore an object of the present invention to provide a PLL circuit which can reduce possibility of occurrence of data error even with a high speed data and reduces influence of noise, due to external disturbance or the like.

According to one aspect of the present invention, a phase locked loop circuit comprises:

phase difference detecting means for detecting a phase difference of an output signal in relation to an input signal;

oscillation means for outputting an output signal having a repetition frequency corresponding to a voltage level of a phase difference signal representative of the phase difference detected by the phase difference detecting means; and control means active when phase advanced condition or phase retarded condition of the output signal relative to the input signal is continued, for control a voltage level of the frequency difference signal depending upon number of times where phase advanced condition or phase retarded condition of the output signal relative to the input signal is continued.

The control means may include a pulse width modulator for generating a pulse width corresponding number of times where phase advanced condition or phase retarded condition of the output signal relative to the input signal is continued, and an integration circuit for integrating a pulse width modulated pulses, an integrated output level of the integration circuit is added to the phase difference signal.

The pulse width modulator may include an up/down counter performing counting up or counting down operation when phase advanced condition or phase retarded condition of the output signal in relation to the input signal is continued and otherwise performing opposite operation, for generating the pulse having the pulse width corresponding to the count value.

The phase locked loop circuit may further comprise temperature detecting means for detecting temperature variation and an adder circuit adding the integrated output level controlled addition characteristics to be constant depending upon the detected temperature to the phase difference signal. In this case, the temperature detecting means is a thermistor variable of resistance value according to a predetermined temperature characteristics, the thermistor is so selected to as cancel variation of resistance value of a resistor forming the adder circuit by variation of resistance value therein.

The phase locked loop circuit may further comprise an alarm means for externally feeding an alarm when the phase difference of the output signal in relation to the input signal becomes greater than or equal to a predetermined value.

The phase difference may be greater than or equal to the predetermined value, is maintained for a given period or longer.

The phase locked loop circuit may further comprise an oscillator generating an oscillation signal having a substantially the same repetition frequency as a repetition frequency of the input signal, and a switching circuit responsive to interrupted condition of the input signal continued for a predetermined period for inputting the oscillation signal of the oscillator to the phase difference detecting means and the control means in place of the input signal. In this case, upon switching from the input signal to the oscillation signal by the switching circuit, and alarm means externally feeding an alarm indicative of switching of input from the input signal to the oscillation signal.

The phase locked loop circuit may further comprise a first counter performing a counting operation when the input signal is low level, a second counter performing counting operation when the input signal is high level; first clear means for clearing the first counter when the count value of the first counter reaches a predetermined value, a second clear means for clearing the count value of the second counter when the count value of the second counter reaches the predetermined value, and an alarm output means for outputting an alarm when at least one of the first and second counter reaches the predetermined value.

In short, the PLL circuit according to the present invention detects the phase difference of the input signal having the reference input signal and the output signal having the dependent frequency signal for generating a pulse width modulated signal having a pulse width corresponding to the detected value. Thus, reaction against variation of the phase is performed quickly to reduce the phase shifting amount and steady phase error fluctuation. Also, when the phase difference greater than the predetermined value, and upon interruption of the input signal, the alarm is generated. In case of interruption of the input signal, the dependent frequency signal is replaced with that according to the built-in oscillator.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structure are not shown in detail in order to avoid unnecessary obscurity of the present invention.

Figure 1:
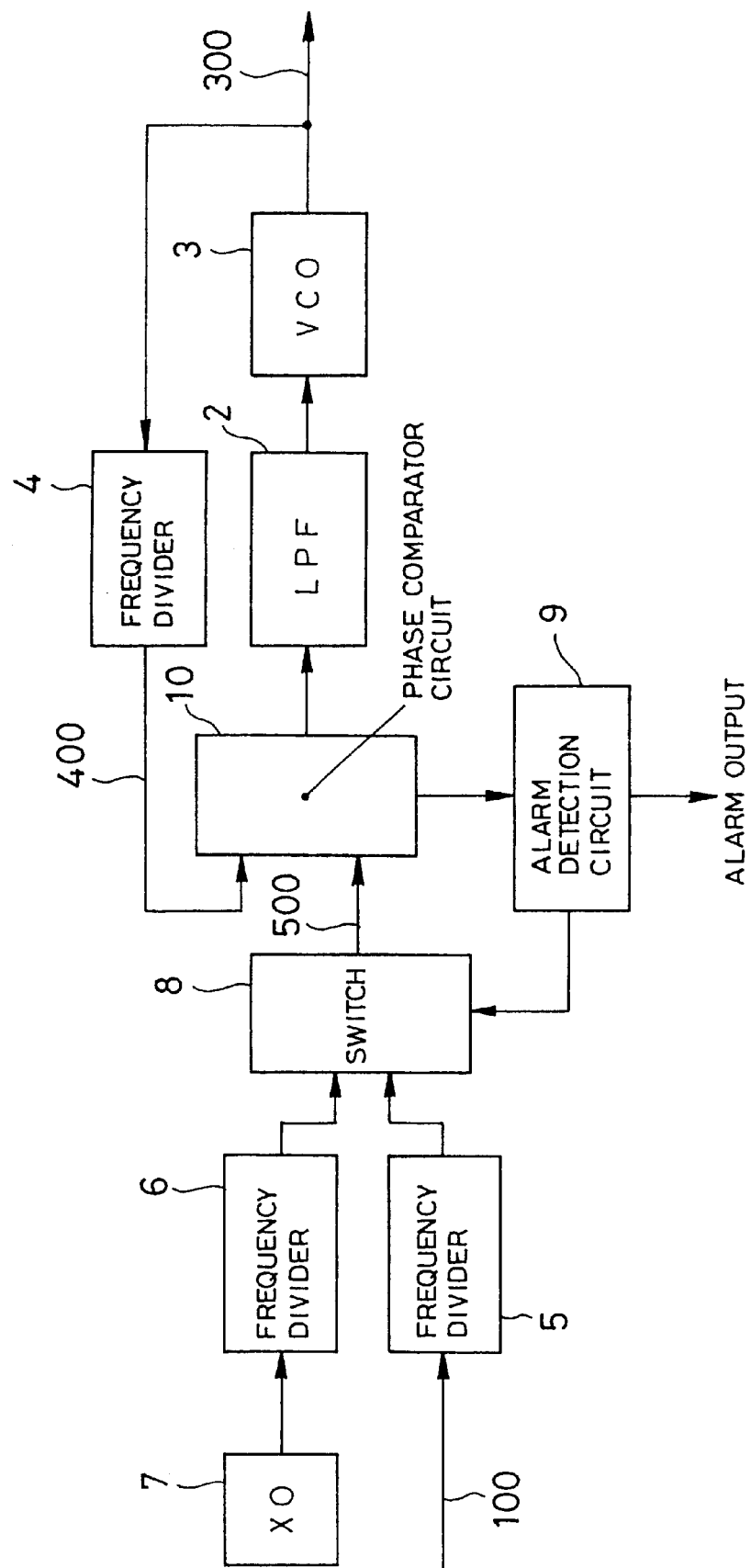
FIG. 1 is a block diagram showing a construction of the preferred embodiment of a PLL circuit according to the present invention.
Figure 15:
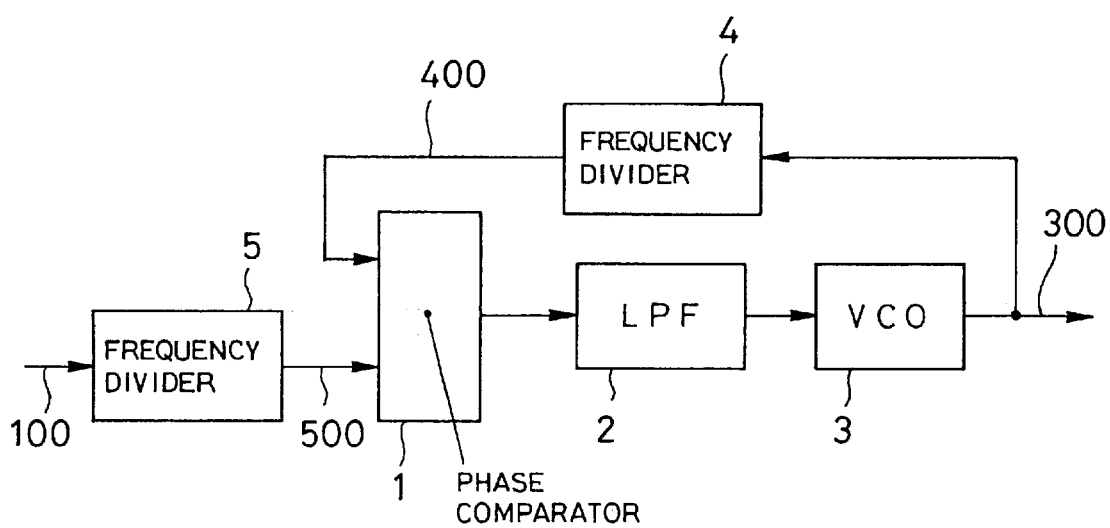
FIG. 15 is a block diagram showing a construction of the conventional PLL circuit.

FIG. 1 is a block diagram showing the preferred embodiment of a PLL circuit according to the present invention. In FIG. 1, the shown embodiment of the PLL circuit is added a function for generating a pulse having a pulse width depending upon a result of phase comparison, integrating the generated pulses and level addition to the result of phase comparison, in a phase comparison circuit 10, to the conventional PLL circuit (FIG. 15). On the other hand, a function for switching to input an oscillation frequency of a crystal oscillator (XO) 7 internally provided to the phase comparison circuit 10 in response to abnormality of phase difference or interruption of clock input, is also added to the conventional circuit.

Figure 2:
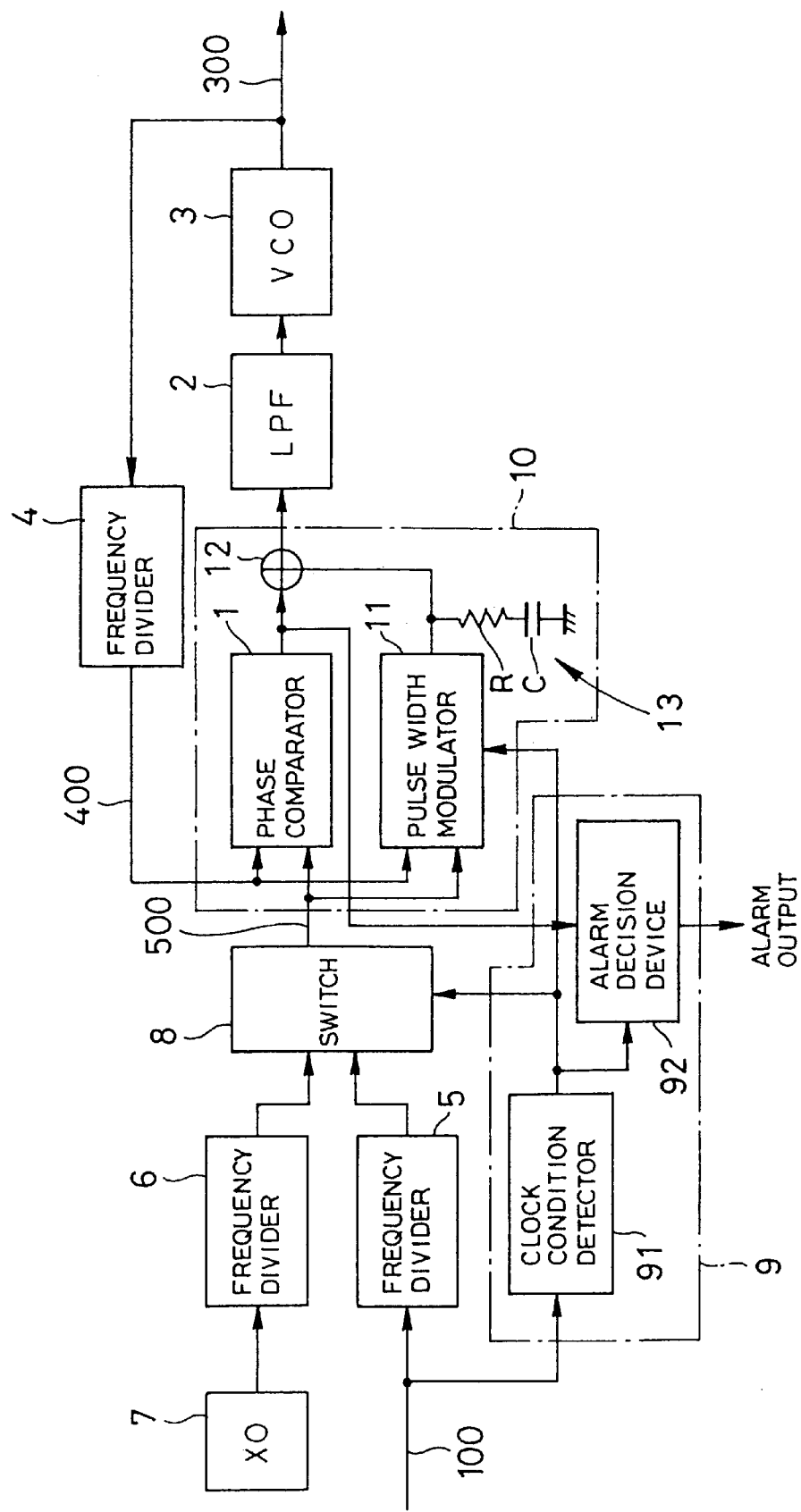
FIG. 2 is a block diagram showing a detailed construction of the preferred embodiment of the PLL circuit of FIG. 1.

More detailed construction of the PLL circuit added the foregoing two functions will be discussed with reference to FIG. 2. As shown in FIG. 2, the shown embodiment of the PLL circuit is constructed with a frequency divider 5 for frequency division of a reference input signal 100, a crystal oscillator 7, a frequency divider 6 for frequency division of an oscillation signal of the crystal oscillator 7, a switch 8 for switching between a signal from the frequency divider 5 and a signal from the frequency divider 6, a frequency divider 4 for frequency division of a dependent frequency signal 300 as an output of the shown circuit, and the phase comparator 1 performing phase comparison of a signal 400 from the frequency divider 4 and a signal 500 from a switch 8.

Also, the shown PLL circuit is constructed with a pulse width modulator 11 for outputting a pulse having a pulse width depending upon a phase difference between the signal 400 and the signal 500, an integration circuit 13 for integrating pulses output from the pulse width modulator 11 by charging a capacitor C via a resistor R, an adder 12 for level addition of an integrated signal output from the integration circuit 13 to a signal from the phase comparator 1, a LPF smoothing an adder output signal of the adder 12 and a VCO 3 outputting a signal 300 having a frequency variable depending upon a voltage level of the smoothed signal.

Furthermore, the shown embodiment of the PLL circuit includes a clock condition detector 91 for monitoring input condition of the reference input signal 100 and an alarm judgment device 92 for outputting an alarm depending upon the phase difference between the output signal of the phase comparator 1 and the signal 500.

As shown by phantom line in FIG. 2, the phase comparator circuit 10 of FIG. 1 is realized with the phase comparator 1, the pulse width modulator 11, the adder 12 and the integration circuit 13. Also, by the alarm judgment device 92 and the clock condition detector 91, an alarm detection circuit 9 in FIG. 1 is realized.

In FIG. 2, the reference input signal 100 is subject to frequency division by the frequency divider 5 down to the frequency to be compared by the phase comparator 1. The frequency divided reference signal is then input to the pulse width modulator 11 as the signal 500 through the switch 8.

On the other hand, the dependent frequency signal 300 output from the VCO 3 is subject to frequency division by the frequency divider 4 down to the frequency to be compared by the phase comparator 1 to be input to the pulse width modulator 11 as the signal 400.

In the pulse width modulator 11, pulse width modulation is performed to produce an output signal variable of pulse width depending upon the phase difference between the signal 500 and the signal 400. The pulse width variable output signal is integrated by the integration circuit 13 and is subject to level addition in the adder 12.

The adder output signal of the adder 12 is smoothed in the LPF 2. Then, an oscillation frequency of the VCO 3 is controlled by smoothed signal. An input voltage of the VCO 3 has a property to decrease frequency according to lowering of potential and to increase frequency according to rising of the potential. Therefore, when a phase of the dependent frequency signal is advanced in relation to the phase of the reference input signal, the output pulse of the VCO steps down to have smaller duty ratio per a given period to sequentially lower the potential through the integrator to lower frequency of the dependent frequency signal with respect to the reference input signal to be approximated with the phase of the reference input signal. On the other hand, when the phase of the dependent frequency signal is retarded in relation to the reference input signal, the output pulse of the VCO steps up to have greater duty ratio per a given period to sequentially rise the potential through the integrator to higher frequency of the dependent frequency signal with respect to the reference input signal to be approximated with the phase of the reference input signal.

After integration of the output of the pulse width modulator 11 by the integration circuit 13, the integrated output is added in level addition to the output of the phase comparator 1. Therefore, response to fluctuation due to phase difference is enhanced to reduce the phase fluctuation and the steady phase error fluctuation due to fluctuation of power source and variation of peripheral temperature to shorten converging period of PLL.

Here, concerning an example of construction of the pulse width modulator 11 in FIG. 2, discussion will be given with reference to FIG. 3. The pulse width modulator 11 is constructed with a D-flip-flop (hereinafter referred to as "DFF") 11*a* taking the signal 400 obtained by N timed frequency division of the dependent frequency signal 300 as D input and the output signal 500 of the switch 8 as a clock input, a DFF 11*b* taking an output Q of the DFF 11*a* as D input and the signal 400 as clock input, an exclusive OR gate 11*c* taking the output Q of the DFF 11*a* and an output 11*b* of the DFF 11*b* as inputs for detecting matching thereof, an up/down counter 11*d* performing counting up or counting down depending upon output of the DFF 11*a*, an up counter 11*e* counting up with taking the count value of the counter 11*d* as input, a NAND gate 11*g* taking the count value of the counter 11*e* as input, and an inverter 11*r* inverting an output of the NAND gate 11*g*. It should be noted that an output of the inverter 11*r* is input to the integrated circuit 13.

On the other hand, the pulse width modulator 11 is constructed with an inverter 11*h* inverting the output Q of the DFF 11*a*, an OR gate 11*j* taking each bit of the count value of the counter 11*d* as input, an OR gate 11*i* outputting an OR of an output of the OR gate 11*j* and an output of the inverter 11*h*, an inverter 11*k* inverting the output of the DFF 11*a*, a NAND gate 11*f* taking the output of the inverter 11*k* and each bit of the count value of the counter 11*d*, and an AND gate 11*m* taking an output of the NAND gate 11*f* and the output of OR gate 11*i* as inputs. It should be noted that the counter 11*d* is placed in enabled condition by an output of the AND gate 11*m*.

Furthermore, the pulse width modulator 11 is constructed with a DFF 11*n* taking the signal 400 as input and frequency divided signal C400 of the signal 400 divided with predetermined frequency division ratio as clock input, an inverter 11*p* for inverting the output of the DFF 11*n*, and an AND gate 11*q* outputting AND if the signal 400 and the output of the inverter 11*p*.

With such construction, the signal 400 derived through N-times frequency division of the dependent frequency signal 300 is input and held in the DFF 11*a*. The output Q of the DFF 11*a* is input and held in the DFF 11*b*. When the output Q of the DFF 11*a* and the output Q of the DFF 11*b* match with each other, namely, when the phase advanced condition or phase retarded condition is maintained, a signal S4 as output of the exclusive OR gate 11*c* becomes "L". Therefore, the count value of the counter 11*d* is not loaded. On the other hand, when phase relationship between the output Q of the DFF 11*a* and the output Q of the DFF 11*b* is varied from phase advanced condition to phase retarded condition or vice versus, the signal S4 as the output of the exclusive OR gate 11*c* becomes "H". Therefore, the count value of the counter 11*d* is loaded. In the shown embodiment, since the input D0~D2 are fixed to "L" and an input D3 is fixed to "H", "1000" is loaded to the counter 11*d*.

When the output Q of the DFF 11*a* is "H", the counter 11*d* performs count down operation. On the other hand, the output Q of the DFF 11*a* is "L", the counter 11*d* performs count up operation. The count outputs Q0 to Q3 of the counter 11*d* becomes inputs D0 to D3 of the counter 11*e*. The counter 11*e* becomes loaded condition by the output of the AND gate 11*q*. To the AND gate 11*q,* the signal 400 is input as is, and also the output signal of the inverter 11*p* inverting the output Q of the DFF 11*n* taking the signal 400 is input. Therefore, during a period where the signal 400 is "H", the counter 11*e* is held in loaded condition.

The count outputs Q0 to Q3 of the counter 11*e* are output via the NAND gate 11*g* and the inverter 11*r*. Only when all of the count outputs Q0 to Q3 are "H", the output of the inverter 11*r* becomes "H". If one of these count outputs Q0 to Q3 is "L", the output of the inverter 11*r* becomes "L". The output of the inverter 11*r* is input to the integration circuit 13 to be integrated therein.

Figure 3:
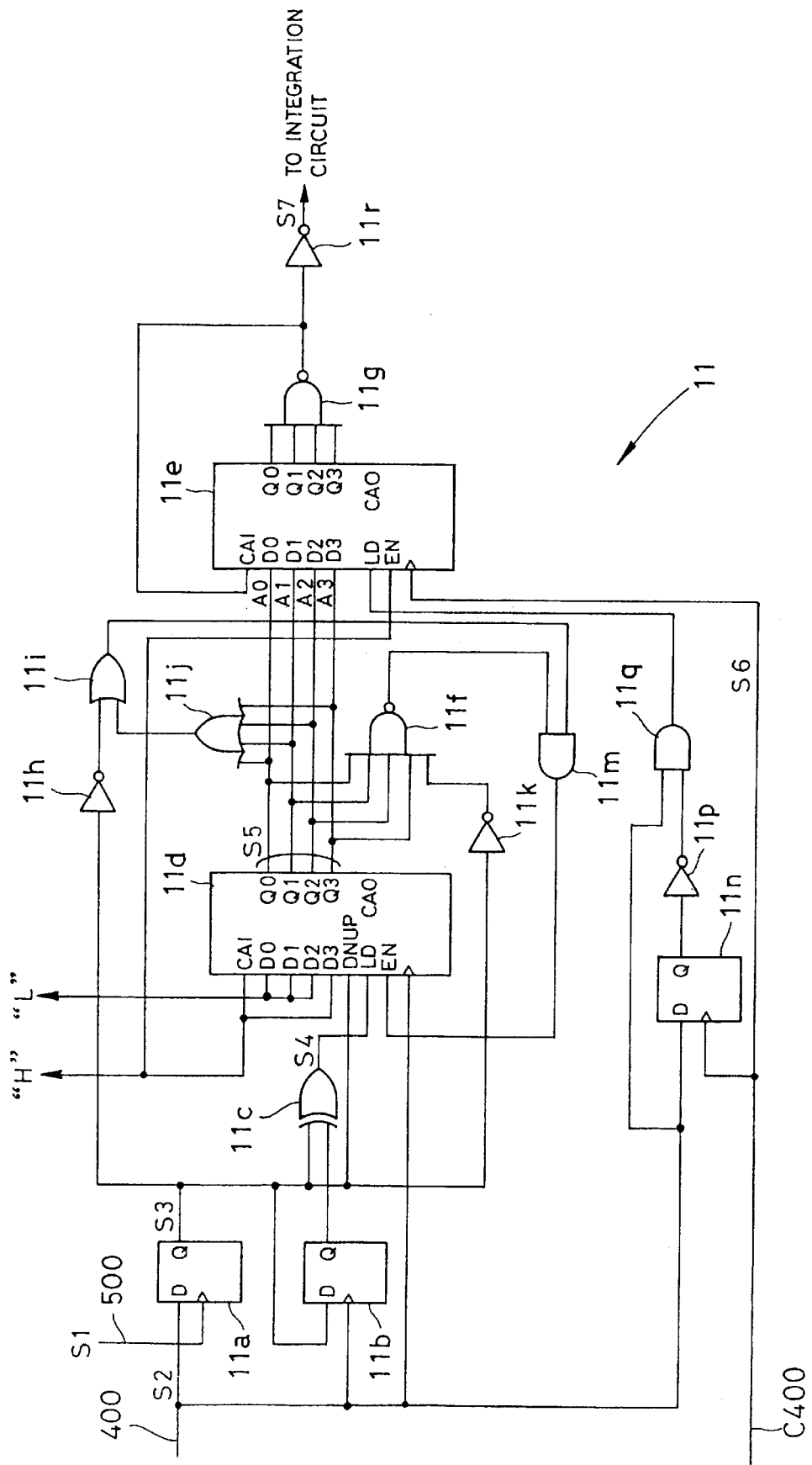
FIG. 3 is a block diagram showing an example of construction of a pulse width modulator of FIG. 2.
Figure 4:
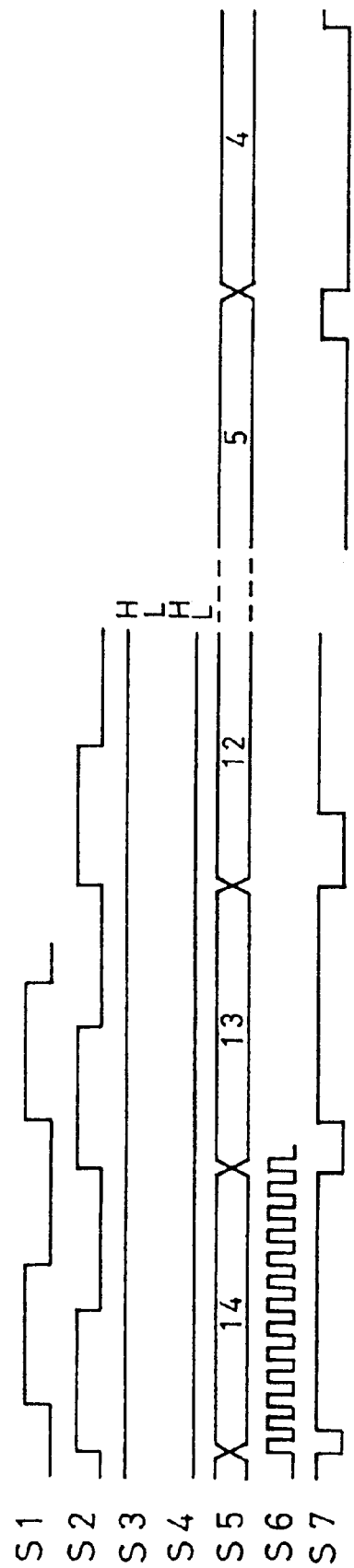
FIG. 4 is a timing chart showing operation of the pulse width modulator of FIG. 3.
Figure 5:
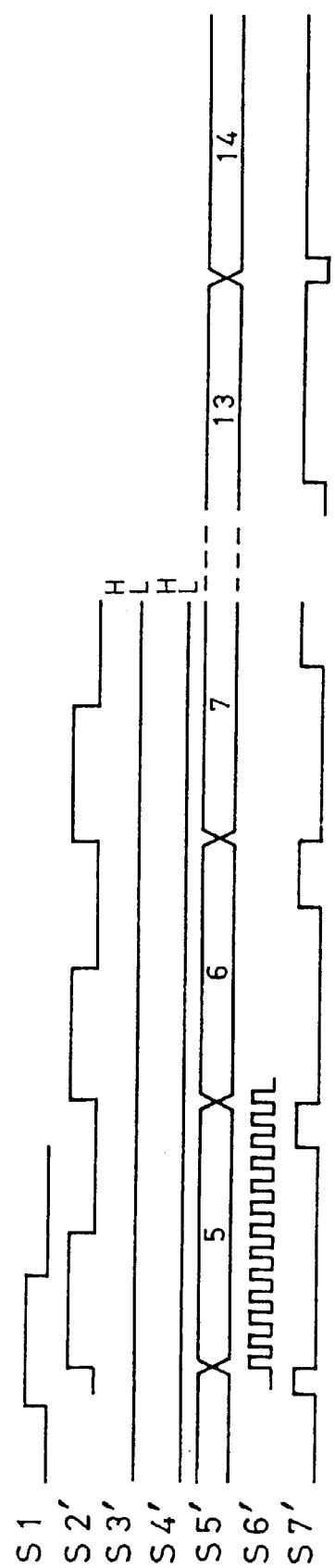
FIG. 5 is a timing chart showing operation of the pulse width modulator of FIG. 3.

FIGS. 4 and 5 are waveform charts showing operation of the pulse width modulator 11. In FIGS. 4 and 5, S1, S2 and so forth are reference signs shown in FIG. 3.

First, when the phase of the dependent frequency signal is maintained advanced in relation to the phase of the reference input signal, a phase relationship between the signal S1 as the signal from the frequency divider 5 and the signal S2 from the frequency divider 4 becomes as shown in FIG. 4. Then, the signal S3 becomes the signal of "H" level. The output of the counter 11*d* becomes a signal S5 of the down counting condition. In FIG. 4, the counter 11*d* is down counted such as "14", "13", "12" . . . "5", "4". This signal S5 becomes a load data of the counter 11*e*. The counter 11*e* is counted by the signal S6 from the load data to output the signal S7 of "H" level by the final count value.

Since the signal S7 loads the signal S5 with a given period, if the phase relationship between the signal S1 and the signal S2 shown in FIG. 4 is maintained, S5 is down counted per given period. As a result, the signal S7 is varied to be pulse having smaller duty ratio, sequentially per the given period.

On the other hand, when the phase of the dependent frequency signal is maintained in a condition retarded in relation to the reference input signal, the phase relationship between the signal S1 from the frequency divider 1 and the signal S2' from the frequency divider 2 becomes as shown in FIG. 5. The signal S3' becomes a signal of "L" level, and the output of the counter 11d becomes a signal S5' in up-counting condition. In FIG. 5, the output of the counter 11d is up-counted as "5", "6", "7", . . . "13", "14". The signal S5' becomes a load data of the counter 11e. Therefore, as shown in FIG. 5, as long as the relationship between the signal S1 and the signal S2' is maintained, the signal S5' is up-counter per a given period. As a result, the duty ratio of the pulse of the signal S7' is increased sequentially per given period.

The signal S7 (signal S7') passes through the integration circuit 13 formed with a resistor R and a capacitor C. Therefore, in case of the pulse having small duty ratio, an output voltage level of the integration circuit 13 is lowered. On the other hand, in case of the pulse having large duty ratio, the output voltage level of the integration circuit 13 is risen.

Accordingly, when the pulse having small duty ratio is generated per given period, the voltage level passed through the integration circuit is sequentially lowered. Thus, the phase of the dependent frequency signal is retarded. Accordingly, when the relationship that the phase of the signal S2 is advanced in relation to the phase of the signal S1 is maintained, while the advancing magnitude is differentiated, the duty ratio of the signal S7 becomes minimum to permit retarding of the phase of the dependent frequency signal under the optimal condition.

On the other hand, when the pulse having large duty ratio is generated per given period, the voltage level passed through the integration circuit is sequentially risen. Thus, the phase of the dependent frequency signal is advanced. Accordingly, when the relationship that the phase of the signal S2 is retarded in relation to the phase of the signal S1 is maintained, while the retarding magnitude is differentiated, the duty ratio of the signal S7 becomes maximum to permit advancing of the phase of the dependent frequency signal under the optimal condition.

It should be noted that, even in FIG. 3, by modifying number of digits of the counters 11d and 11e, the pulse width to be output from the pulse modulator in response to a demand for various response of loop gain, step, phase, frequency and so forth, can be modified easily.

Figure 6:
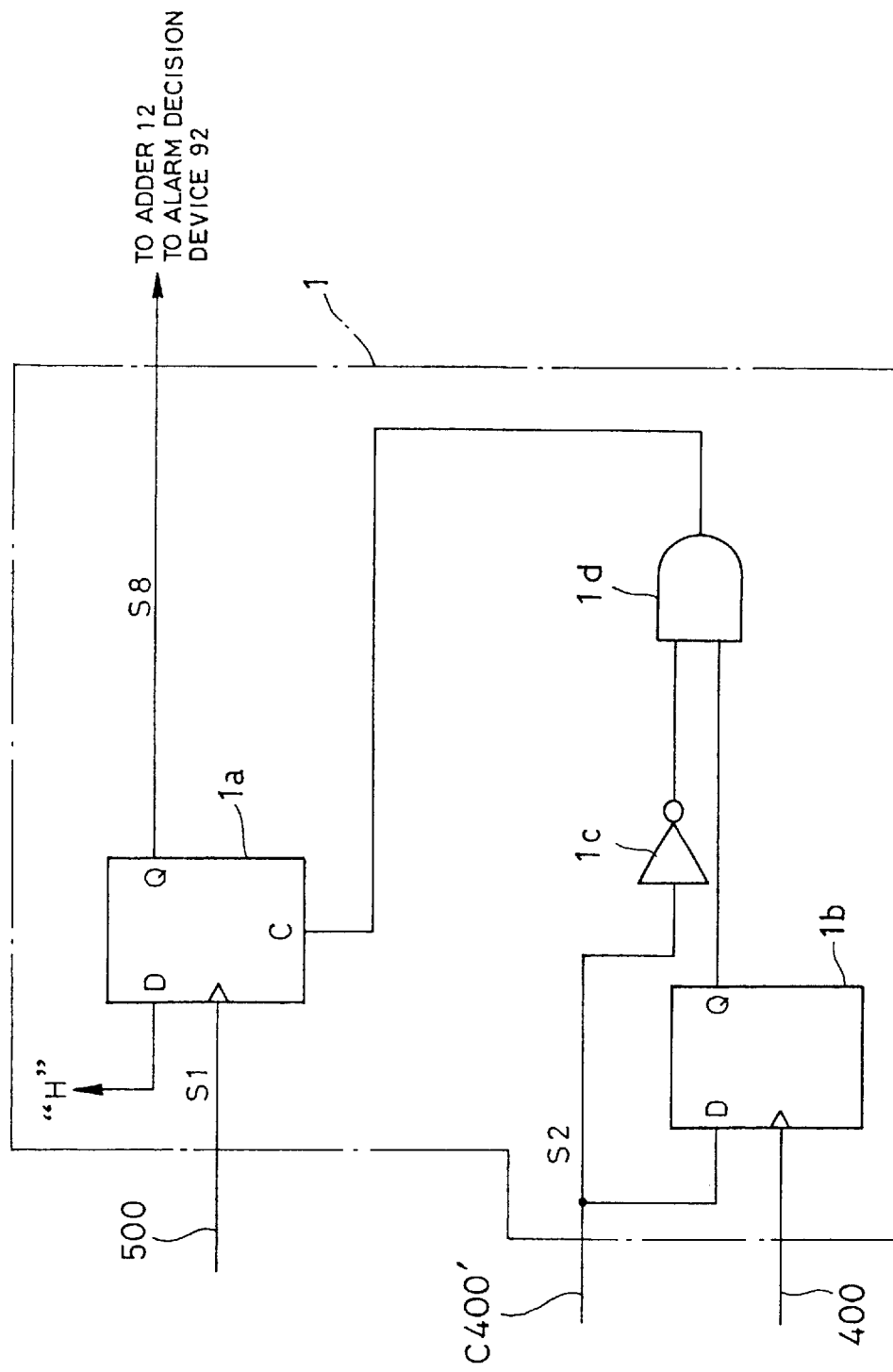
FIG. 6 is a block diagram showing an example of construction of a phase comparator of FIG. 2.

Next, discussion will be given for an example of construction of the phase comparator 1 in FIG. 2 with reference to FIG. 6. In FIG. 6, the phase comparator 1 is constructed with a DFF 1a taking the signal 500 from the switch 8 as clock input and fixed the D input at "H", a DFF 1b taking the signal 400 as clock input and the signal C400' obtained by frequency division of the signal 400 with a given frequency dividing ratio, an inverter 1c inverting the signal C400', and an AND gate 1d taking the output of the inverter 1c and the output Q of the DFF 1b as inputs. It should be noted that by an output of the AND gate 1d, the output of the DFF 1a is controlled in cleared condition.

Figure 7:
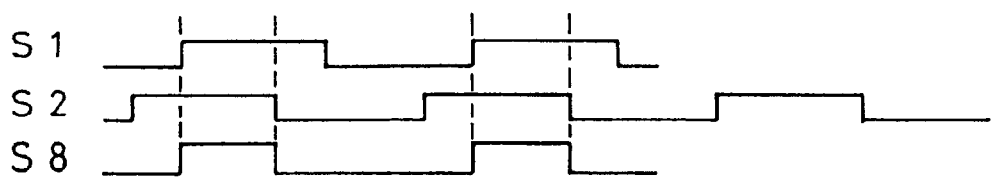
FIG. 7 is a timing chart showing operation of the phase comparator of FIG. 6.
Figure 8:
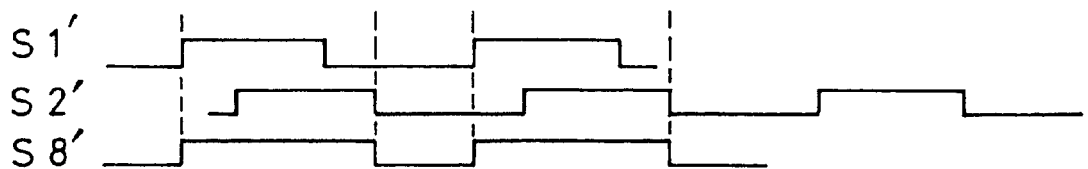
FIG. 8 is a timing chart showing operation of the phase comparator of FIG. 6.

FIGS. 7 and 8 are waveform charts showing operation of the phase comparator 1. At first, as shown in FIG. 7, when the phase of the dependent frequency signal 300 is advanced in relation to the reference input signal 100, the phase of the signal S2 is advanced in relation to that of the signal S1. Then, the signal S8 is output from the DFF 1a as the pulse having small duty ratio. On the other hand, as shown in FIG. 8, when the phase of the dependent frequency signal 300 is advanced in relation to the reference input signal 100, the phase of the signal S2' is retarded from the phase of the signal S1'. Then, the signal S8' is output from the DFF 1a as the pulse having large duty ratio.

The signal S8 (signal S8') shown in FIGS. 7 and 8 have pulse width according to a phase difference between the reference input signal and the dependent frequency signal. It is the conventional PLL circuit to control the VCO 3 by inputting the signal S8 (signal S8') to the LPF 2 as is. In the shown PLL circuit, after adding the voltage level which is a result of integration of the output of the foregoing pulse width modulation 11 by the integration circuit 13 to the output of the phase comparator 1 by the adder 12, the output of the adder 12 is input to the LPF 2 for controlling the VCO 3. Therefore, a converging period to reach the lock condition of PLL can be shortened.

Figure 9:
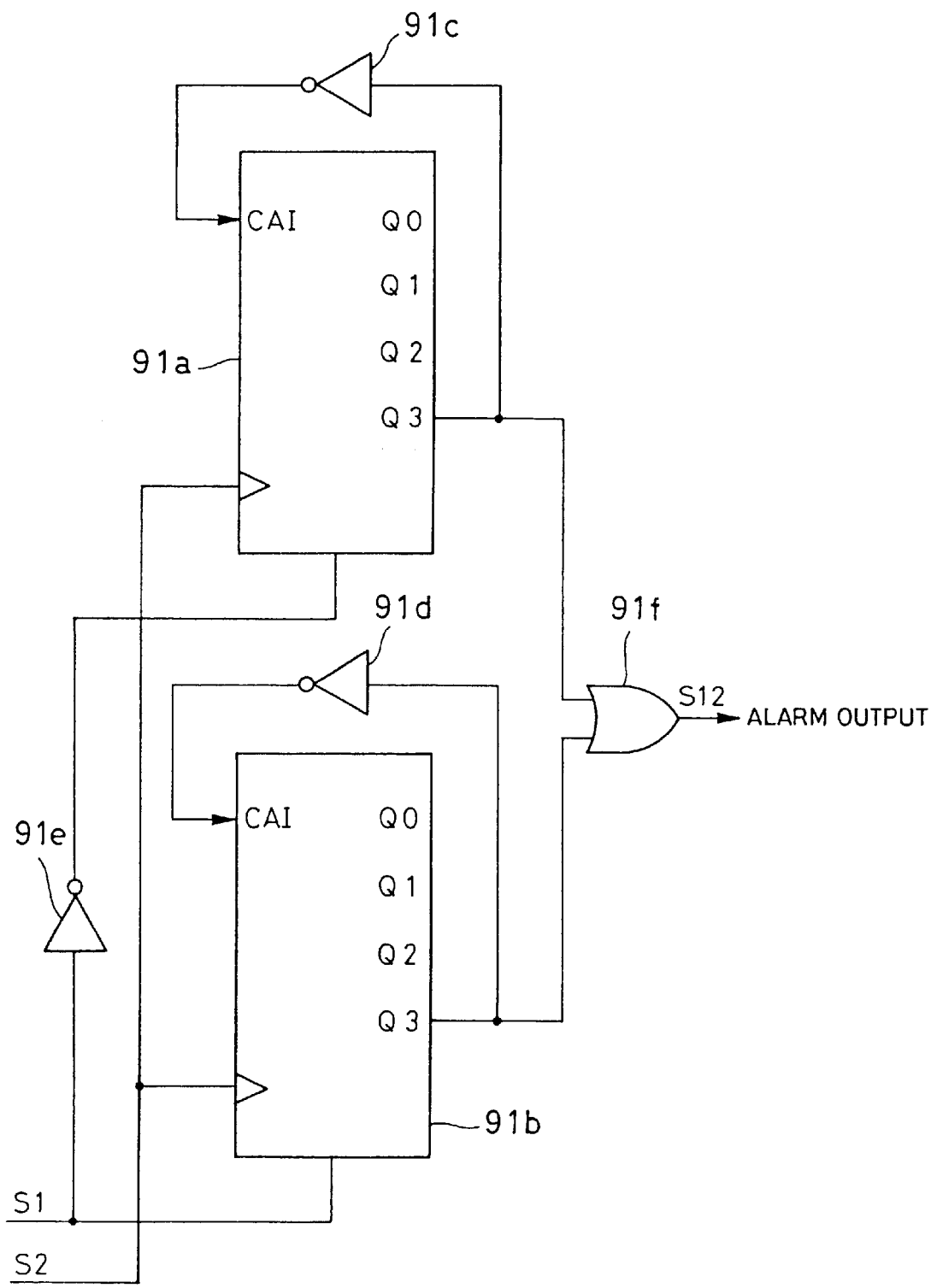
FIG. 9 is a block diagram showing an example of construction of a clock condition detector of FIG. 2.

An example of the construction of the clock condition detector 91 of FIG. 2 will be discussed with reference to FIG. 9. In FIG. 9, the clock condition detector 91 is constructed with an inverter 91e inverting the reference input signal S1, a counter 91a performing counting operation when the output of the inverter 91e is "H" (when the reference input signal S1 is "L"), a counter 91b performing counting operation when the reference input signal S1 is "H", an inverter 91c for clearing the count value of the counter 91a when the output Q3 of the counter 91a becomes "H", namely, when the count value reaches "1000" ("8" in decimal), an inverter 91d for clearing the count value of the counter 91b when the output Q3 of the counter 91b becomes "H", namely, when the count value reaches "1000" ("8" indecimal), and an OR gate 91f outputting the signal S12 as an alarm output of "H" level when one of the output Q3 of the counter 91a and the output Q3 if the counter 91b is "H".

With the construction set forth above, when the reference input signal S1 is input constantly, namely in the condition where "H" and "L" levels are repeatedly input alternately, the counters 91a and 91b are cleared the count value before the own outputs Q3 become "H". Accordingly, in the condition where the reference input signal S1 is input constantly, the signal S12 as the alarm output is not output.

On the other hand, when inputting of the reference input signal S1 is interrupted, namely in the abnormal condition where the reference input signal S1 is fixed at "H" or "L", counting up of the counter 91a or 91b is performed. Then, when the output Q3 of the counter 91a or 91b becomes "H", namely when the count value becomes "1000", the signal S12 as the alarm output is output.

In short, the clock condition detector 91 may detect abnormal condition of the reference input signal. As set forth, when the reference input signal is interrupted, switching of the signal by the switch 8 is performed to use the oscillation signal of the crystal oscillator 7 which is built in the circuit in place of the reference signal 100. By this, a signal obtained by frequency division of the oscillation signal of the crystal oscillator 7 by the frequency divider 6 is output from the switch 8. Then, the dependent frequency signal 300 synchronized with the signal output from the switch 8 is output. It should be noted that it may be possible to externally output the alarm to notify occurrence of switching in the switch 8.

Figure 10:
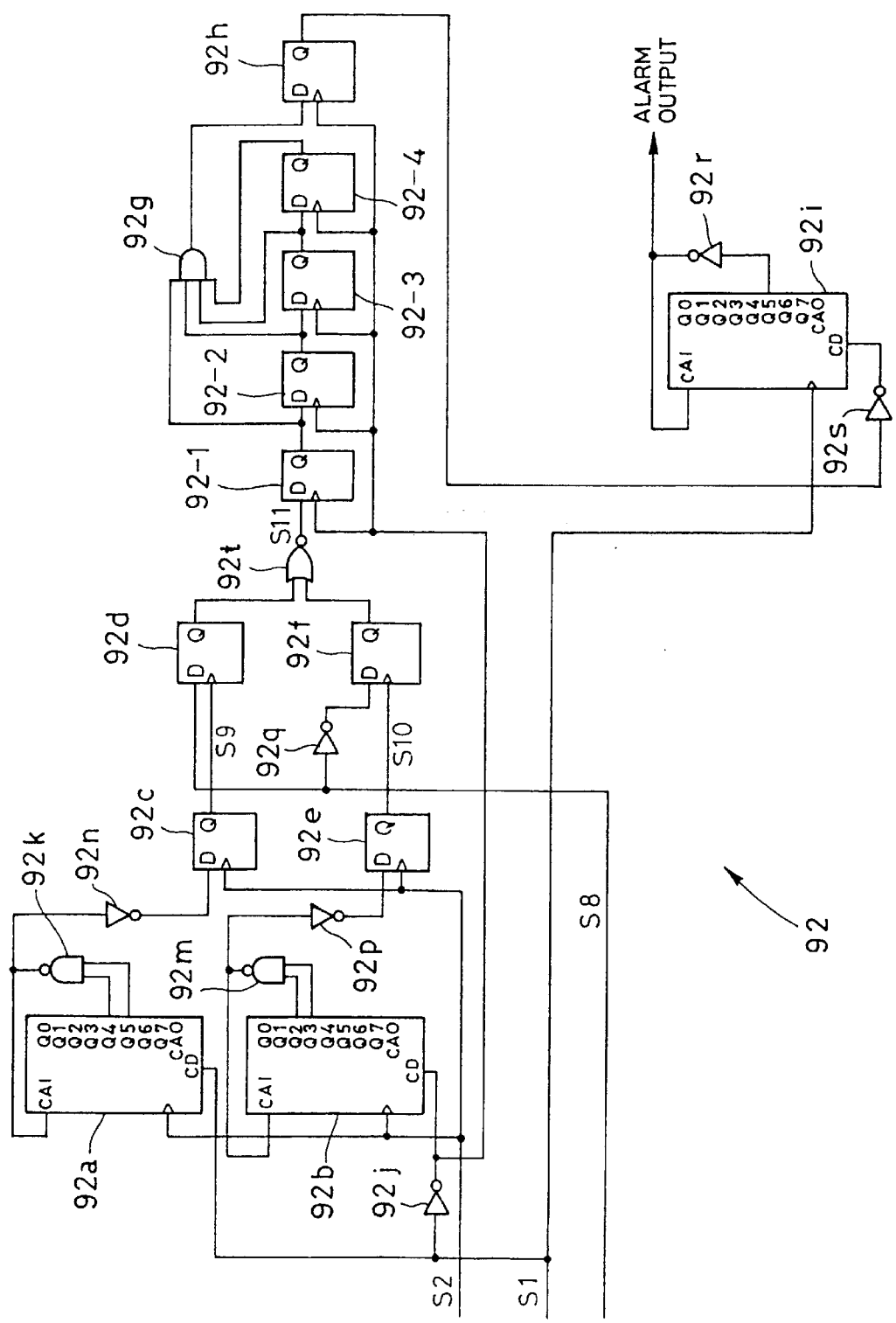
FIG. 10 is a block diagram showing an example of construction of an alarm judgment device of FIG. 2.

An example of construction of the alarm judgment device 92 of FIG. 2 will be discussed with reference to FIG. 10. In FIG. 10, the alarm judgment device 92 is constructed with counters 92a and 92b performing counting operation when inputs to terminals CD are "H", NAND gates 92k and 92m for resetting the counters 92a and 92b, inverters 92n and 92p inverting respective outputs of the NAND gates 92k and 92m, DFFs 92c and 92e receiving and holding the inverted signals, DFFs 92d and 92f operating with taking the signals S9 and S10 as outputs of the DFFs 92c and 92e, a NOR gate 92t receiving the outputs of the DFFs 92d and 92f, DFFs 92-1 to 92-4 sequentially feeding a signal S11 as output of the NOR gate 92t to later stage, an AND gate 92g receiving outputs of the DFFs 92-1 to 92-4, a DFF 92h receiving and holding the output of the AND gate 92g, an inverter 92s inverting an output of the DFF 92h, a counter 92i performing counting operation when the signal inverted by the inverter 92s is "H", and an inverter 92r inverting an output Q5 of the counter 92i for clearing the count value and generating the alarm output. It should be noted that since an inverter 92j is provided, either one of the counters 92a and 92b is operated. Also, since an inverter 92q is provided, mutually inverted values are input to the DFF 92d and DFF 92f.

With the construction set forth above, by outputs Q4 and Q5 of the counter 92a performing counting operation, the count value of the counter 92a is cleared via the NAND gate 92k. On the other hand, by outputs Q2 and Q3 of the counter 92b, the count value of the counter 92b is cleared via the NAND gate 92m. The output of the NAND gate 92k is inverted by the inverter 92n and then is input to the DFF 92c. On the other hand, the output of the NAND gate 92m is inverted by the inverter 92p and then is input to the DFF 92e. It should be noted that since the signal S1 is input to the counter 92a as is and signal S1 is inverted by the inverter 92j and then is input to the counter 92b, either one of inputs of the signal S1 is interrupted, either of counters 92a and 92b starts counting operation.

As set forth above, since the timings to clear the counters 92a and 92b are fixed, phase relationship between the signal S9 as the output of the DFF 92c and the signal S10 as output of the DFF 92e is fixed. The signal S9 becomes the clock input of the DFF 92d, and signal S10 becomes the clock input of the DFF 92f. To the DFF 92d, the signal 8 is input as is, and to the DFF 92f, the signal 8 is inverted by the inverter 92q and input.

The output Q of the DFF 92d and the output Q of the DFF 92f are input to the NOR gate 92t. Therefore, at least one of these outputs Q is "H", "L" is constantly input to the DFFs 92-1 to 92-4. In contrast to this, when both outputs Q are "L", "H" is input to the DFF 92-1 and then fed to later stages of DFFs 92-2 to 92-4.

When all of outputs Q of DFFs 92-1 to 92-4 are "H", the output of the AND gate 92g becomes "H", and then is input to the DFF 92h. Namely, only when both of outputs Q of the DFF 92d and the DFF 92f are "L" sequentially for four clocks, the output Q of the DFF 92h becomes "H". The output Q of the DFF 92h is inverted by the inverter 92s to be the signal for making the counter 92i to perform counting operation. When the counting operation of the counter 92i is progressed and the output Q5 thereof becomes "H", the count value is cleared by the inverter 92r, and in conjunction therewith, an alarm is output.

Figure 11:
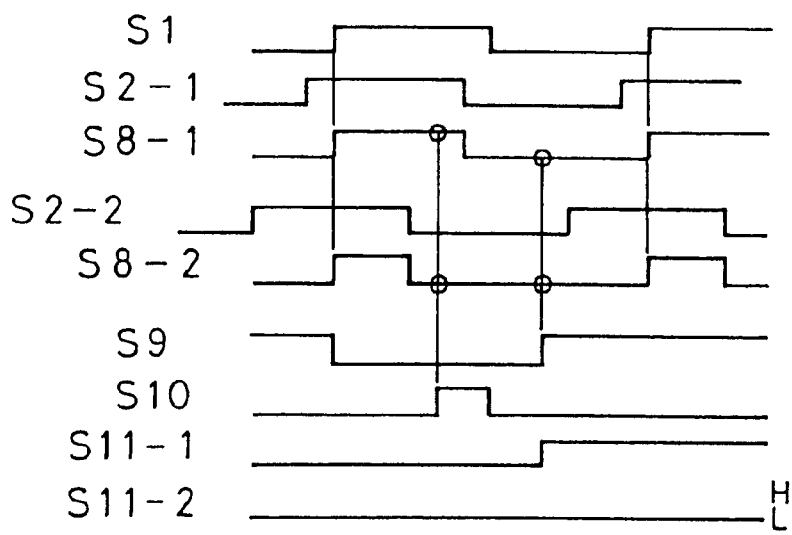
FIG. 11 is a waveform chart showing operation of the alarm judgment device of FIG. 10.
Figure 12:
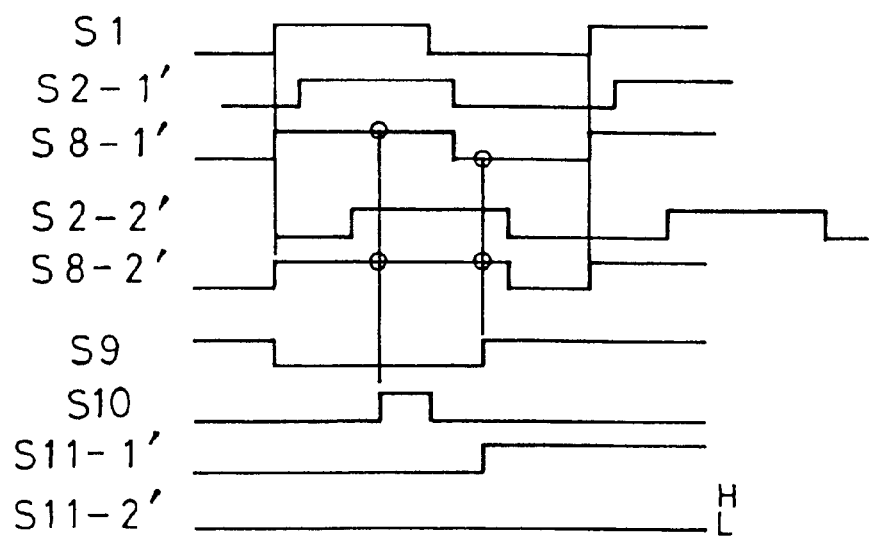
FIG. 12 is a waveform chart showing operation of the alarm judgment device of FIG. 10.

FIGS. 11 and 12 are waveform charts showing operation of the alarm judgment device 92. As shown in FIG. 11, consideration is given for the case where the phase of the dependent frequency signal S2-1 is advanced in relation to the phase of the reference input signal S1. In this case, the signal S8-1 at the rising timing of the signal S10 is "H" and the signal S8-1 at the rising timing of the signal S9 is "L". Namely, it means that a logical level of the signal S8-1 is varied within a window from rising timing of the signal S10 to the rising timing of the signal S9. Accordingly, the signal S11-1 as output of the NOR gate 92t is varied from "L" to "H" at the rising timing of the signal S9. The output of the AND gate 92g as AND of respective outputs Q of the DFFs 92-1 to 92-4 is "H", and the output of the DFF 92h is "H". Therefore, the counter 92i does not perform counting operation. Therefore, the alarm output is "H" to indicate normal state.

Here, when the phase of the dependent frequency signal S2-2 is significantly advanced in relation to the phase of the reference input signal S1, the signal S8-2 at the rising timing of the signal S10 is "L", and the signal S8-2 at the rising timing of the signal S9 is "L". Namely, since the phase is excessively advanced, the logical level of the signal S8-2 is not varied within the window between the rising timing of the signal S10 and the rising timing of the signal S9. Accordingly, the signal S11-2 as the output of the NOR gate 92t is held "L". Therefore, when a condition of "L" of a signal S11-2 is caused, the output of the AND gate 92g as AND of respective outputs Q of the DFFS 92-1 to 92-4 is "L", and the output of the DFF 92h is "L". Therefore, the counter 92i performs counting operation. The counting operation of the counter 92i is continued until all outputs Q of four DFFs 92-1 to 92-4 become "H". Accordingly, even if normal condition is temporarily restored, the counter 92i continues counting operation until normal operation is continued for four times.

When the counting operation of the counter 92i is continued, and the count value reaches "00100000", the output becomes "H". Therefore, the alarm output becomes "L" by the inverter 92r to indicate abnormal condition.

Since alarm is not output until the count value of the counter 92i reaches a predetermined value, the counter 92i operates as a timer up to generation of alarm. Accordingly, even when abnormal state is caused temporarily, if the normal condition is restored subsequently, the timer is stopped.

As set forth, until outputting of the alarm signal, continuity of abnormal condition and invariability of alarm condition by the timer are checked. Namely, continuity of alarm condition is detected by four stage construction of the DFFs 92-1 to 92-4, and confirms that alarm condition is not varied by the timer circuit to prevent malfunction of alarm judgment due to noise caused by external disturbance or the like.

On the other hand, as shown in FIG. 12, consideration is given for the case where the phase of the dependent frequency signal S2-1' is retarded in relation to the reference input signal S1. In this case, the signal S8-1' at the rising timing of the signal S10 is "H" and the signal S8-1' at the rising timing of the signal S9 is "L". Namely, the logical level of the signal S8-1' is varied in the window between the rising timing of the signal S10 and the rising timing of the signal S9. Accordingly, the signal S11-1' as output of the NOR gate 92t is varied from "L" to "H" at rising timing of the signal S9. Therefore, since the output of the AND gate 92g as AND of respective outputs Q of the DFFs 92-1 to 92-4 is "H", and the output of the DFF 92h is "H", the counter 92i does not perform counting operation. Accordingly, alarm output is "H" to indicate normal condition.

Here, when phase of the dependent frequency signal S2-2' is significantly retarded in relation to the phase of the reference input signal S1, the signal S8-2' at the rising timing of the signal S10 is "L" and the signal S8-2' at the rising timing of the signal S9 is "L". Namely, phase is excessively retarded, the logical level of the signal S8-2' does not be varied in the window between the rising timing of the signal S10 and the rising timing of the signal S9. Accordingly, the signal S11-2' as output of the NOR gate 92t is held "L". Thus, similarly to the case of FIG. 11, the counter 92i performs counting operation. The counting operation of the counter 92i is continued until all outputs Q of the DFFs 92-1 to 92-4 become "H". When the count value reaches "00100000", the output Q becomes "H". Therefore, the alarm output becomes "L" by the inverter 92r to indicate abnormal condition.

On the other hand, in FIG. 10, the outputs Q4 and Q5 of the counter 92a are input to the NAND gate 92k, and the outputs Q2 and Q3 of the counter 92b are input to the NAND gate 92m to form the window set forth above. Accordingly, by varying outputs of the counters 92a and 92b to be input to the NAND gates 92k and 92m, the width of the window can be varied freely. By making the width of the window narrower, slight abnormality can be detected. Namely, when the phase difference greater than or equal to an arbitrarily determined given value is continuously caused, the alarm is output. Therefore, the given value can be varied easily.

On the other hand, by modifying number of stages of the DFF 92-1 to 92-4, a value of times of continuously causing phase difference greater than or equal to the given value for alarming, can be modified to permit outputting of high quality alarm.

For the counters 92a and 92b and DFFs 92-1 to 92-4 and so forth, it is typical to realize utilizing known programmed logic device (PLD). The internal structure of the PDL can be modified easily. Therefore, width of the window and continuing times can be varied easily.

Figure 13:
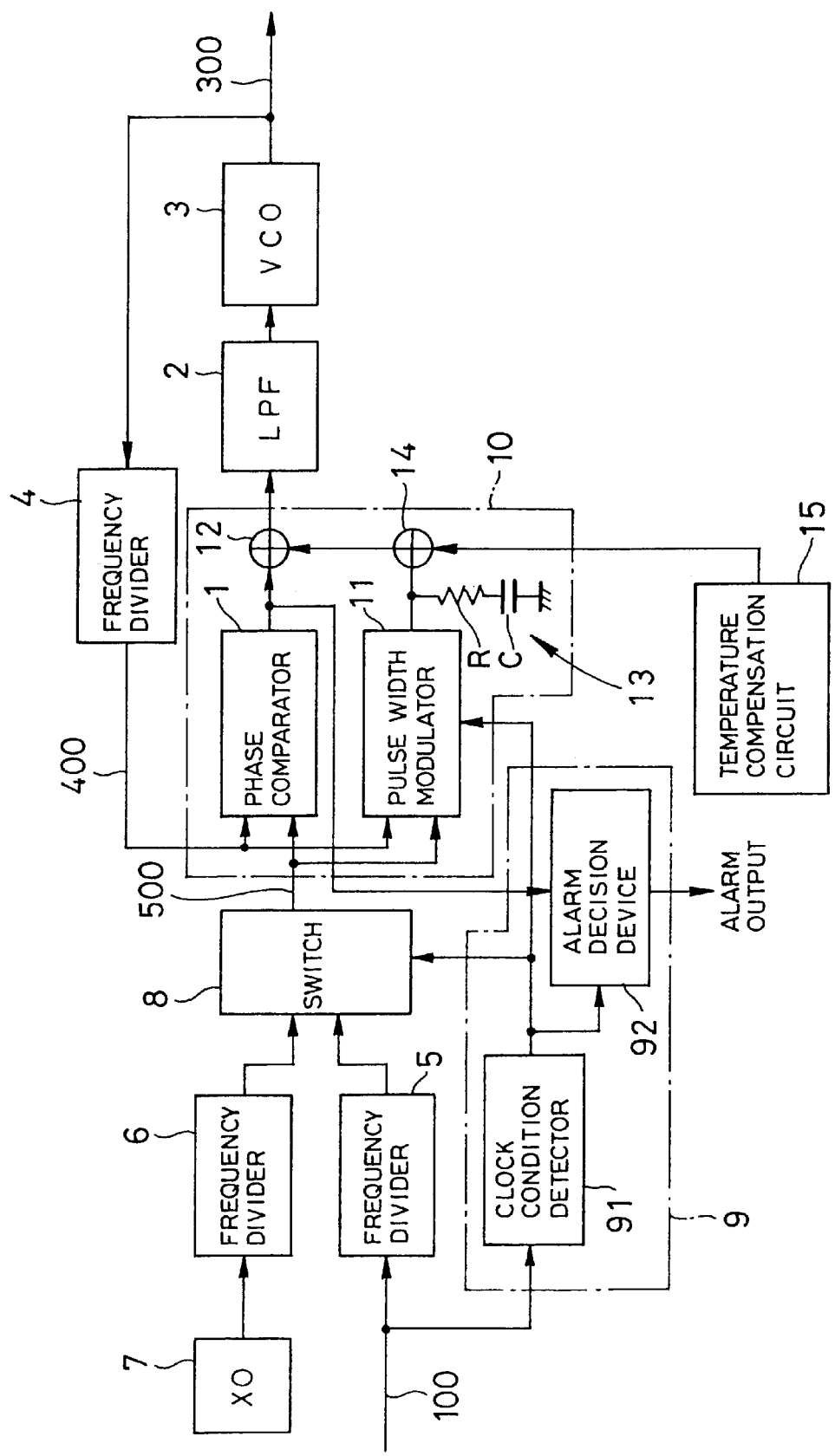
FIG. 13 is a block diagram showing a detailed construction of the PLL circuit added a temperature compensation circuit.

When the PLL circuit is constructed as set forth above, convergence characteristics of PLL is variable depending upon temperature. Therefore, as shown in FIG. 13, a temperature compensation circuit detecting temperature variation and compensating the variation may be added to the construction shown in FIG. 2. Namely, in FIG. 13, an adder 14 is inserted between the integration circuit 13 and the adder 12. In the adder 14, an output of the temperature compensation circuit 15 is added to the output of the integration circuit 13.

Figure 14:
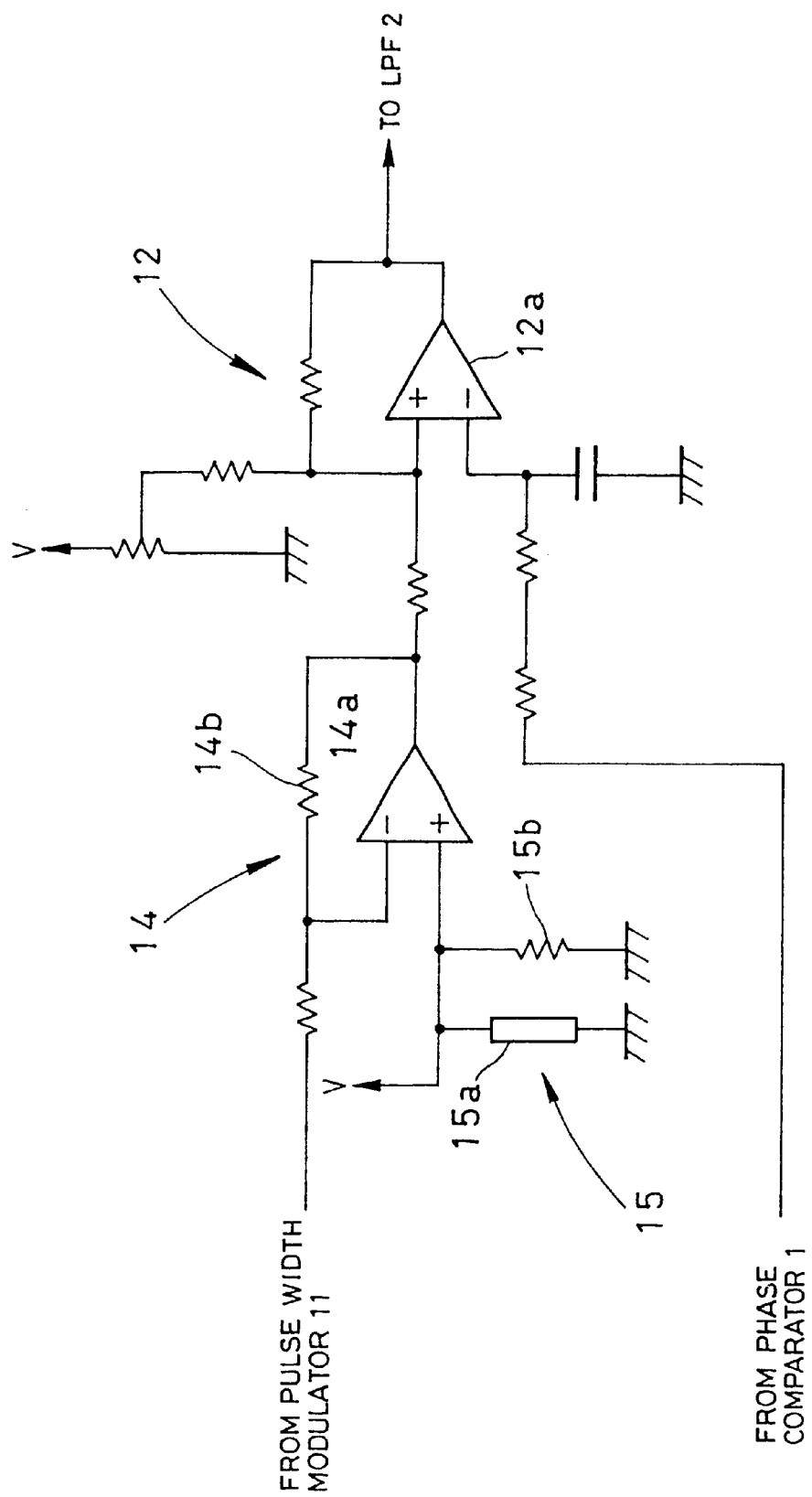
FIG. 14 is an illustration showing an example of construction of an adder 14 and a temperature compensation circuit 15.

FIG. 14 shows an example of construction of the adder circuit 14 and the temperature compensation circuit 15. As shown in FIG. 14, the adder 14 is constructed with an operational amplifier 14a, a negative feedback resistor 14b and so forth. On the other hand, the temperature compensation circuit 15 includes a thermistor 15a and a resistor 15b connected in parallel with the thermistor 15a so that variation of the resistance value of the resistor 15b due to temperature variation is canceled by variation of resistance value of the thermistor 15a. By applying the output of the temperature compensation circuit 15 to a non-inverting input terminal of the operational amplifier 14a, the voltage level at the non-inverting input terminal can be maintained constant irrespective of the temperature variation. To the inverting input terminal of the operational amplifier 14a, the output of the pulse width modulator 11 is applied. Therefore, for the voltage level of the output of the pulse width modulator 11, the output voltage level of the temperature compensation circuit 15 is added in the adder 14. Then, the output of the adder 14 is fed to the adder 12.

The adder 12 is constructed with operational amplifier 12a or the like. In the adder 12, the output of the pulse width modulator 11 as temperature compensated by the temperature compensation circuit 15 and the adder 14, is added to the output of the phase comparator 1. Then, the output of the adder 12 is fed to the LPF 2 as set forth above. Controlling oscillation frequency of the VCO 3 by the output of the LPF 2, the PLL circuit shown in FIG. 1 can be realized.

Furthermore, when interrupted condition of the clock is detected by the clock condition detector 91, the switch 8 is operated to switch to the oscillation signal of the crystal oscillator 7 incorporated in the PLL circuit to continue operation, the oscillation signal can be fed continuously.

As set forth above, the present invention can shorten convergence period of PLL by generating a pulse width depending upon phase difference between the reference input signal and the dependent frequency signal to add to the output of the phase comparator to enhance response to variation of the phase difference to reduce phase variation amount and steady phase error fluctuation due to fluctuation of the power source and variation of environmental temperature. Also, by providing the circuit which can detect condition of the reference input signal to enable switching to the crystal oscillator when the reference input signal is interrupted, to maintain continuous supply of the oscillation signal. Furthermore, by providing the temperature compensation circuit, influence of the environmental temperature variation can be minimized.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A phase locked loop circuit ("PLL") comprising:

phase difference detecting means for detecting a phase difference of a PLL output signal in relation to an input signal;

oscillation means for outputting the PLL output signal having a repetition frequency corresponding to a voltage level of a phase difference signal representative of the phase difference detected by said phase difference detecting means; and control means active when phase advanced condition or phase retarded condition of the PLL output signal relative to the input signal is continued, for controlling a voltage level of said frequency difference signal depending upon a number of times the phase advanced condition or phase retarded condition of the output signal relative to the input signal is continued, wherein said control means includes a pulse width modulator for generating a pulse width corresponding number of times the phase advanced condition or phase retarded condition of the output signal relative to the input signal is continued, and an integration circuit for integrating a pulse width modulated pulses, an integrated output level of said integration circuit is added to said phase difference signal.

2. A phase locked loop circuit as set forth in claim 1, wherein said pulse width modulator includes an up/down counter performing counting up or counting down operation when phase advanced condition or phase retarded condition of said PLL output signal in relation to said input signal is continued and otherwise performing opposite operation, for generating the pulse having the pulse width corresponding to the count value.

3. A phase locked loop circuit as set forth in claim 1, which further comprises temperature detecting means for detecting temperature variation and an adder circuit adding said integrated output level controlled addition characteristics to be constant depending upon the detected temperature to said phase difference signal.

4. A phase locked loop circuit as set forth in claim 3, wherein said temperature detecting means is a thermistor variable of resistance value according to a predetermined temperature characteristics, said thermistor is so selected to as cancel variation of resistance value of a resistor forming said adder circuit by variation of resistance value therein.

5. A phase locked loop circuit as set forth in claim 1, which further comprises an alarm means for externally feeding an alarm when the phase difference of said PLL output signal in relation to said input signal becomes greater than or equal to a predetermined value.

6. A phase locked loop circuit as set forth in claim 5, wherein said alarm means externally feeds said alarm when a condition where the phase difference is greater than or equal to the predetermined value, is maintained for a given period or longer.

7. A phase locked loop circuit as set forth in claim 1, which said oscillation means comprises an oscillator generating an oscillation signal having a substantially the same repetition frequency as a repetition frequency of said input signal, and a switching circuit responsive to interrupted condition of said input signal continued for a predetermined period for inputting said oscillation signal of said oscillator to said phase difference detecting means and said control means in place of said input signal.

8. A phase locked loop circuit as set forth in claim 7, wherein upon switching from said input signal to said oscillation signal by said switching circuit, and alarm means externally feeding an alarm indicative of switching of input from said input signal to said oscillation signal.

9. A phase locked loop circuit as set forth in claim 7, which further comprises a first counter performing a counting operation when said input signal is low level, a second counter performing counting operation when said input signal is high level; first clear means for clearing said first counter when said count value of said first counter reaches a predetermined value, a second clear means for clearing the count value of said second counter when the count value of said second counter reaches said predetermined value, and an alarm output means for outputting an alarm when at least one of said first and second counter reaches said predetermined value.

* * * * *